(12) United States Patent
Liang et al.

(10) Patent No.: US 12,262,161 B2
(45) Date of Patent: Mar. 25, 2025

(54) ELECTRONIC DEVICE PORT

(71) Applicant: Apple Inc., Cupertino, CA (US)

(72) Inventors: Jiahui Liang, San Francisco, CA (US); Andrew L. Doyle, San Francisco, CA (US); Yingyi Wang, Jiangsu (CN); Yu Song, Shanghai (CN)

(73) Assignee: APPLE INC., Cupertino, CA (US)

( * ) Notice: Subject to any disclaimer, the term of this patent is extended or adjusted under 35 U.S.C. 154(b) by 35 days.

(21) Appl. No.: 17/809,556

(22) Filed: Jun. 28, 2022

(65) Prior Publication Data

US 2023/0247336 A1 Aug. 3, 2023

Related U.S. Application Data

(60) Provisional application No. 63/267,374, filed on Jan. 31, 2022.

(51) Int. Cl.
| | |
|---|---|
| *H05K 5/00* | (2006.01) |
| *H04R 1/02* | (2006.01) |
| *H04R 1/08* | (2006.01) |
| *H05K 5/02* | (2006.01) |

(52) U.S. Cl.
CPC ............ *H04R 1/023* (2013.01); *H04R 1/086* (2013.01); *H05K 5/0214* (2022.08); *H05K 5/0215* (2022.08); *H04R 2499/11* (2013.01)

(58) Field of Classification Search
None
See application file for complete search history.

(56) References Cited

U.S. PATENT DOCUMENTS

| | | | | |
|---|---|---|---|---|
| 10,165,694 | B1 * | 12/2018 | Werner | H04R 1/028 |
| 2017/0181303 | A1 * | 6/2017 | Li | B29C 45/1671 |
| 2021/0407748 | A1 * | 12/2021 | Wang | H01H 13/86 |

* cited by examiner

*Primary Examiner* — Anthony M Haughton
*Assistant Examiner* — Rashen E Morrison
(74) *Attorney, Agent, or Firm* — Dorsey & Whitney LLP

(57) ABSTRACT

An electronic device can include a housing defining an aperture, a membrane extending across the aperture, and a non-metallic woven support mesh disposed parallel to the flexible membrane and extending across the aperture. In at least one example, the membrane is acoustically transparent and the membrane is air permeable and water impermeable. In addition, the support mesh can be less flexible than the membrane such that the support mesh structurally supports the membrane.

19 Claims, 10 Drawing Sheets

ELECTRONIC DEVICE PORT

CROSS-REFERENCE TO RELATED APPLICATION(S)

This application claims the benefit of U.S. Provisional Patent Application No. 63/267,374, filed 31 Jan. 2022, entitled "ELECTRONIC DEVICE PORT," the entire disclosure of which is hereby incorporated by reference.

FIELD

The present disclosure relates generally to electronic devices. More particularly, the present disclosure relates to ports and port assemblies of electronic devices.

BACKGROUND

Many electronic devices include internal components that interact in some way with the external environment through apertures or ports in the outer housing of the device. For example, environmental sensors, antennas, and other components can send and receive signals through housing apertures and speakers can move air and pressure waves through the apertures to create sound. However, unwanted particles and other pollutants from the external environment, which may enter into the internal volume of the device through the apertures, can interfere with the proper functioning of the internal components and damage the device. In addition, when subject to high pressure environments, for example submersion in water, the pollutants may be more prone to pass through the apertures and any membranes of the apertures or ports can be strained to the point of damage or failure. Therefore, what is needed are ports and port assemblies that protect the internal components of the device from damage while preserving the functionalities of the internal components.

SUMMARY

In at least one example of the present disclosure, an electronic device can include a housing defining an aperture, a membrane extending across the aperture, and a non-metallic woven support mesh disposed parallel to the flexible membrane and extending across the aperture. In at least one example, the membrane is acoustically transparent. In at least one example, the membrane is air permeable and water impermeable. In at least one example, the support mesh includes a monofilament string mesh. In at least one example, the support mesh includes fabric. In at least one example, the support mesh is less flexible than the membrane.

In at least one example, the support mesh is a first support mesh and the electronic device also includes a second support mesh extending across the aperture parallel to the membrane with the membrane disposed between the first support mesh and the second support mesh. In at least one example, the second support mesh is visible from an external environment outside the electronic device. In at least one example, the second support mesh includes a non-metallic woven support mesh. In at least one example, the second support mesh includes a metal or plastic cosmetic mesh.

In at least one example of the present disclosure, an electronic device port includes an aperture defined by a housing, a support mesh, a cosmetic mesh spaced apart from the support mesh and externally visible from the outside of the device, and a water impermeable membrane disposed between the support mesh and the cosmetic mesh.

In at least one example, the support mesh includes a flexible woven mesh. In at least one example, the support mesh comprises a rigid perforated mesh comprised of metal or plastic. In at least one example, a surface of the support mesh facing the water impermeable membrane includes a contact area reduction feature. In at least one example, the contact area reduction feature includes a dimple. In at least one example, the contact area reduction feature includes a micro-textured surface feature.

In at least one example of the present disclosure, an electronic device port includes an aperture defined by a housing, a first woven support mesh extending across the aperture, a second woven support mesh extending across the aperture and spaced apart from the support mesh, and a water impermeable membrane extending between the first flexible support mesh and the second flexible support mesh.

In at least one example, the water impermeable membrane is more flexible than the first woven support mesh and the second woven support mesh. In at least one example, the second woven support mesh is externally visible from outside the housing. In at least one example, the electronic device port also includes a mesh cap over-molded peripherally around the first woven support mesh.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
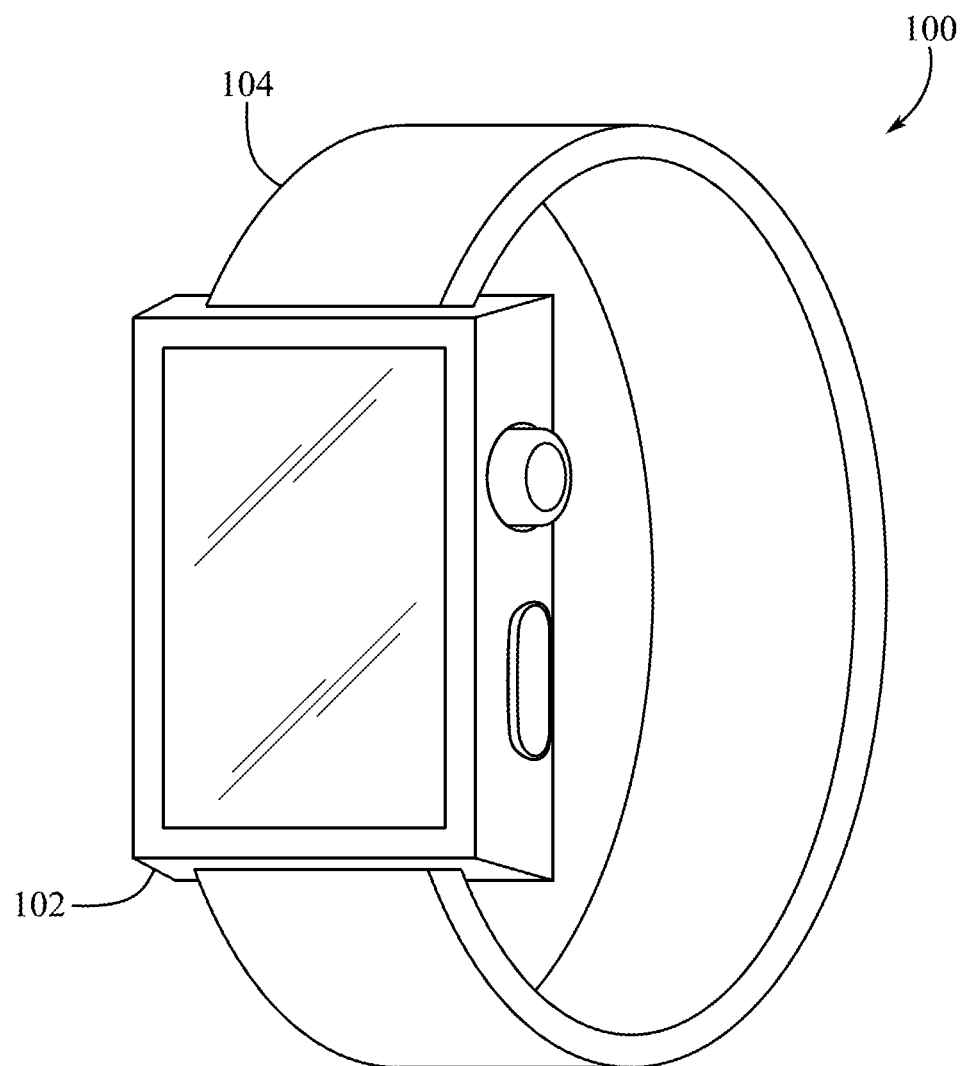
FIG. 1A shows a perspective view of an example of an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Ports and port assemblies described herein, which may include one or more membranes extending across an aperture defined by a housing of an electronic device, can be incorporated into the device in order to prevent unwanted ingress of external particles and pollutants, while allowing air, pressure waves, and signals to pass through. In this way, the internal components of the electronic device can interact with the external environment through the apertures while being protected from damage.

In addition, the ports and port assemblies described herein are configured to prevent membranes and meshes of the port from sticking together and to prevent damage. Often, when speakers are disposed internally to move air and sound/pressure waves through an aperture, one or more acoustic membranes of a port are flexible such that the membrane deflects in response to vibrations induced by the speaker, or in response to exposure to high pressures, such as when the device is submerged in water. The deflection of the membrane as it vibrates in conjunction with the speaker output, reduces sound attenuation through the port. However, excessive deflection can lead to failure and damage of the membrane in the port, as well as cause sticking between the various meshes and membranes.

Over time, as salts or other debris and particles from the external environment cross the membrane of the port, those salts and debris can build up on adjacent meshes or port components and effectively adhere or "stick" the two membranes or meshes together. In this way, the membrane can become permanently stuck such that it no longer vibrates or deflects as part of its normal function such that speaker performance (and thus sound quality) is reduced.

In order to prevent membrane damage and maintain the proper functioning of internal components, at least one example of an electronic device can include a housing that defines an aperture and a membrane that extends across the aperture. In addition, a non-metallic woven support mesh can be disposed parallel to the flexible membrane and extend across the aperture. The membrane can be an acoustic membrane or a barometric membrane that allows air to pass through, but prevents particles from passing through the aperture from the external environment. The support mesh can be disposed close enough to the membrane that the support mesh prevents the membrane from deflecting too far and experiencing damaging strains.

In at least one example, the non-metallic woven support mesh is flexible such that it deflects along with the membrane. The support mesh can also include features that reduce the surface area which contacts the adjacent membrane when the adjacent membrane is flexed to the point of contacting the support mesh. The reduced contact surface area between the support mesh and the membrane reduces the chances of built-up debris and salt from forming a strong enough bond between the two components to cause permanent or damaging sticking. In addition, the flexible nature of the support mesh causes the support mesh to elastically rebound when flexed, which produces a restoring force against the membrane when the device is subjected to high-pressure environments. This restoring force helps separate the membrane from the mesh when the high-pressure is removed, even if some amount of salt or other debris has built up between the two components over time.

These and other embodiments are discussed below with reference to FIGS. 1-6D. However, those skilled in the art will readily appreciate that the detailed description given herein with respect to these Figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

In the present disclosure, a wearable electronic watch is used as an example of an electronic device that incorporates the ports, port components, and port configurations described herein. This smart watch is used for illustrative purposes only to show an example implementation of the ports and port configurations of the present disclosure but the ports, port components, and port configurations can implemented in any number of electronic devices other than a wearable electronic watch, which includes an internal component interacting with the environment external to the device, for example speakers and sensors. Examples of ports, port components, and port configurations disclosed herein can be included in any number of electronic devices, including but not limited to desktop computers, laptop computers, tablets, smartphones, smart speakers, wearable electronic devices such as fitness trackers, smart watches, head-mountable-display devices or other alternate/virtual reality devices, and so forth.

Along these lines, FIG. 1A shows an example of an electronic device 100. The electronic device shown in FIG. 1A is a watch, such as a smartwatch. The smartwatch of FIG. 1A is merely one representative example of a device that can be used in conjunction with the systems and methods disclosed herein. Electronic device 100 can correspond to any form of wearable electronic device, a portable media player, a media storage device, a portable digital assistant ("PDA"), a tablet computer, a computer, a mobile communication device, a GPS unit, a remote control device, or other electronic device. The electronic device 100 can be referred to as an electronic device, or a consumer device. In some examples, the electronic device 100 can include a housing 102 that can carry operational components, for example, in an internal volume at least partially defined by the housing. The electronic device 100 can also include a strap 103, or other retaining component that can secured the device 100 to a body of a user as desired. Further details of the electronic device are provided below with reference to FIG. 1B.

Figure 1B:
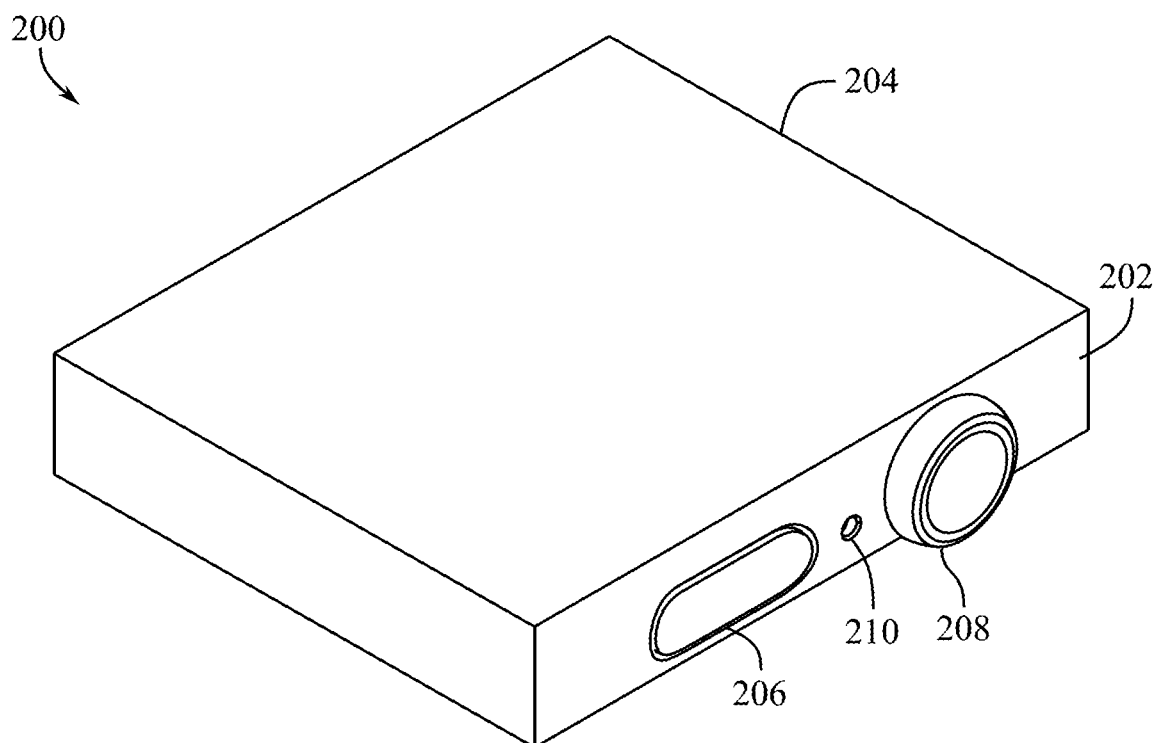
FIG. 1B shows a top perspective view of a portion thereof.

FIG. 1B illustrates a smartwatch 200 that can be substantially similar to, and can include some or all of the features of the devices described herein, such as electronic device 100. The device 200 can include a housing 202, and a display assembly 204 attached to the housing. The housing 202 can substantially define at least a portion of an external surface of the device 200.

The display assembly 204 can include a glass, a plastic, or any other substantially transparent external layer, material, component, or assembly. The display assembly 204 can include multiple layers, with each layer providing a unique function, as described herein. Accordingly, the display assembly 204 can be, or can be a part of, an interface component. The display assembly 204 can define a front external surface of the device 200 and, as described herein, this external surface can be considered an interface surface. In some examples, the interface surface defined by display assembly 204 can receive inputs, such as touch inputs, from a user.

In some examples, the housing 202 can be a substantially continuous or unitary component and can define one or more openings to receive components of the electronic device 200. In some examples, the device 200 can include input components such as one or more buttons 206 and/or a crown 208 that can be disposed in the openings. In some examples, a material can be disposed between the buttons 206 and/or crown 208 and the housing 202 to provide an airtight and/or watertight seal at the locations of the openings. The housing 202 can also define one or more openings or apertures, such as aperture 210 that can allow for sound to pass into or out of the internal volume defined by the housing 202. For example, the aperture 210 can be in communication with a microphone component disposed in the internal volume. In some examples, the housing 202 can define or include a feature, such as an indentation to removably couple the housing 202 and a strap or retaining component.

Figure 1C:
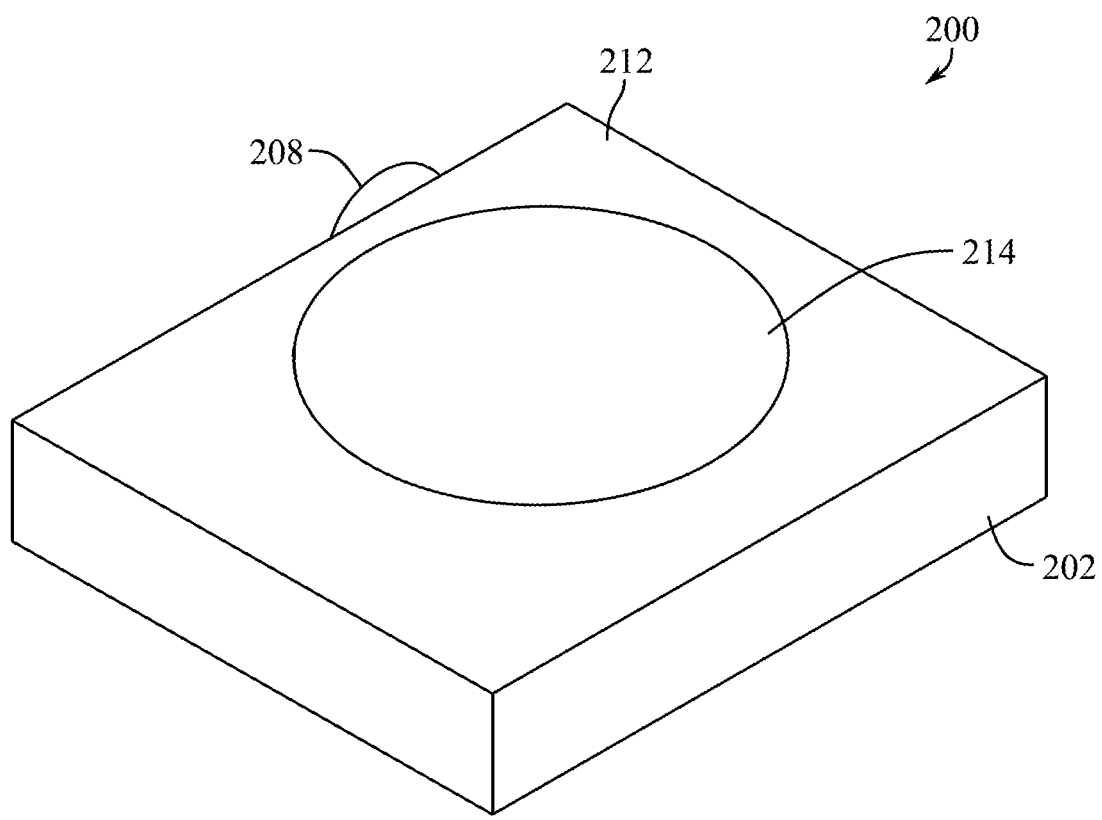
FIG. 1C shows a bottom perspective view of a portion thereof.

FIG. 1C shows a bottom perspective view of the electronic device 200. The device 200 can include a back cover 212 that can be attached to the housing 202, for example, opposite the display assembly 204. The back cover 212 can include ceramic, plastic, metal, or combinations thereof. In some examples, the back cover 212 can include an at least partially electromagnetically transparent component 214. The electromagnetically transparent component 214 can be transparent to any desired wavelengths of electromagnetic radiation, such as visible light, infrared light, radio waves, or combinations thereof. In some examples, the electromagnetically transparent component 214 can allow sensors and/or emitters disposed in the housing 202 to communicate with the external environment. Together, the housing 202, display assembly 204 and back cover 212 can substantially define an internal volume and an external surface of the device 200.

Figure 1D:
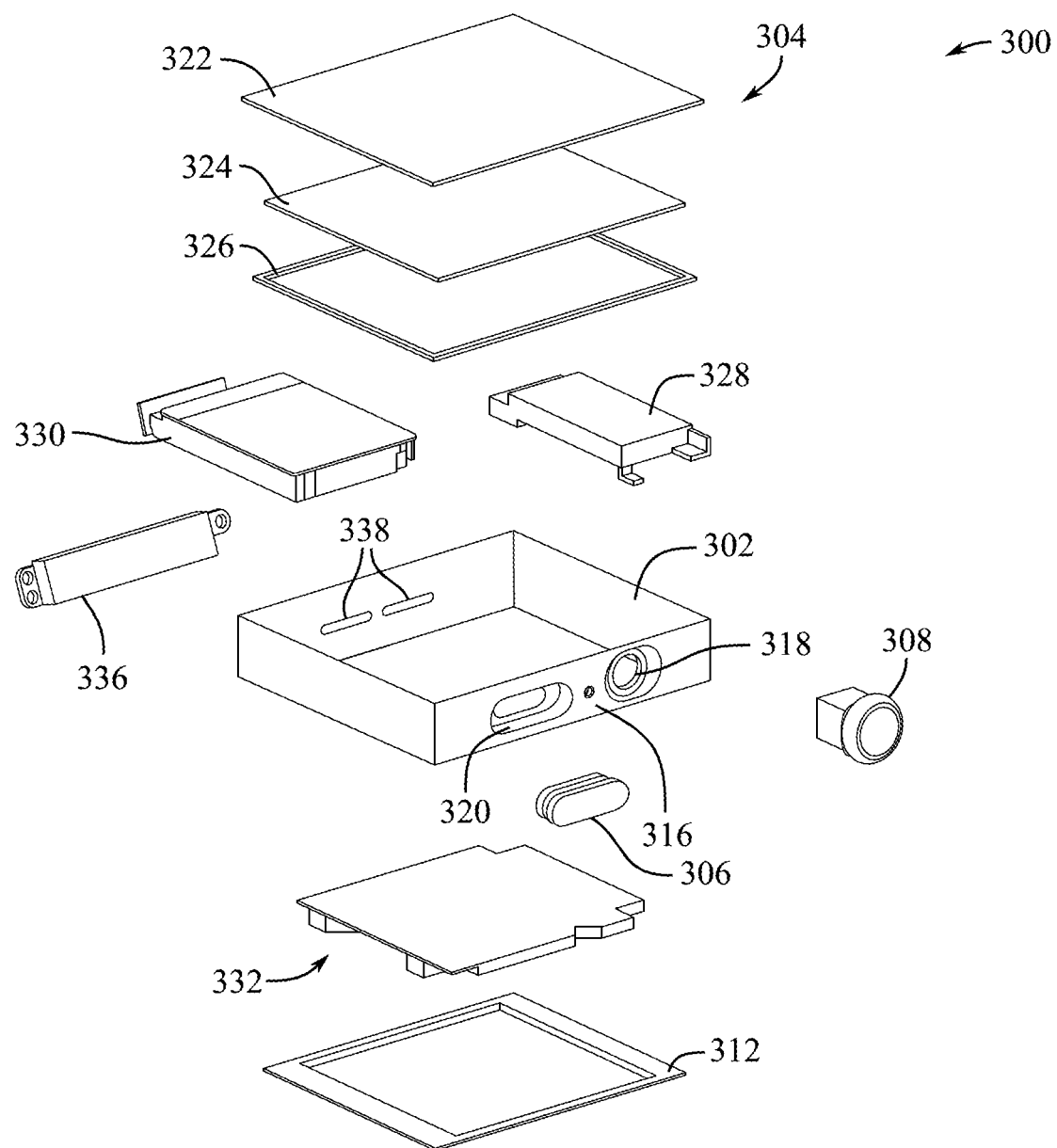
FIG. 1D shows an exploded view thereof.

FIG. 1D illustrates an exploded view of a smartwatch 300 that can be substantially similar to, and can include some or all of the features of the devices described herein, such as electronic devices 100 and 200. The device 300 can include a housing 302, a display assembly 304, and a back cover 312. Together, the housing 302, display assembly 304, and back cover 312 can define an external surface and an internal volume of the device 300.

The housing 302 can be a substantially continuous or unitary component, and can define one or more apertures 316, 338 to receive components of the electronic device 300 and/or to provide access to an internal portion of the electronic device 300. In some examples, the device 300 can include input components such as one or more buttons 306 and/or a crown 308 that can be disposed in the apertures 318, 320. In addition, at least one example of the housing 302 defines one or more apertures 318, 320, 338 that provide an internal component access to the environment external to the device 300 and housing 302.

The display assembly 304 can be received by and can be attached to the housing 302. The display assembly can include a cover including a transparent material, such as plastic, glass, and/or ceramic. The display assembly 304 can also include a display stack or display assembly that can include multiple layers and components, each of which can perform one or more desired functions. For example, the display stack can include a display layer 324 that can include a touch detection layer or component, a force sensitive layer or component, and one or more display layers or components that can include one or more pixels and/or light emitting portions to display visual content and/or information to a user. In some examples, the display layer or component 324 can include a liquid crystal display (LCD), a light emitting diode (LED) display, an organic light emitting diode (OLED) display, and/or any other form of display. The display layer 324 can also include one or more electrical connectors to provide signals and/or power to the display layer 324 from other components of the device 300.

In some examples, the device 300 can include a gasket or seal 326 that can be disposed between the display assembly 304 and the housing 302 to substantially define a barrier to the ingress of liquids or moisture into the internal volume from the external environment at the location of the seal 326. As described herein, the seal 326 can include polymer, metal, and/or ceramic materials. The device 300 can also include a seal 334 that can be disposed between the housing 302 and the back cover 312 to substantially define a barrier to the ingress of liquids or moisture into the internal volume from the external environment at the location of the seal 334. As described herein, the seal 334 can include polymer, metal, and/or ceramic materials. The seal 334 can be substantially similar to and can include some or all of the features of the seal 326.

The device 300 can also include internal components, such as a haptic engine 328, a battery 330, an audio module 336, and a logic board 332, also referred to as a main logic board 332 that can include a system in package (SiP) disposed thereon, including one or more integrated circuits, such as processors, sensors, and memory. The SiP can also include a package.

In some examples, the device 300 can include one or more wireless antennas that can be in electrical communication with one or more other components of the device 300. In some examples, one or more antennas can receive and/or transmit wireless signals at one or more frequencies and can be, for example, one or more of a cellular antenna such as an LTE antenna, a Wi-Fi antenna, a Bluetooth antenna, a GPS antenna, a multi-frequency antenna, and the like. The antenna or antennas can be communicatively coupled to one or more additional components of the electronic device 300. In some examples, one or more other components of the device 300 can include a portion or part of an antenna, such as a radiating element thereof.

The internal components can be disposed within the internal volume defined at least partially by the housing 302, and can be affixed to the housing 302 via adhesives, internal surfaces, attachment features, threaded connectors, studs, posts, or other features, that are formed into, defined by, or otherwise part of the housing 302 and/or the cover 322 and/or back cover 312.

In addition to those components and features of device 300, both internal and external to the housing 302, shown in FIG. 1D, an example of a device can also include one or more electronic components disposed within the internal volume of the device 300 that communicates with an external environment (i.e., an environment outside/external to the housing 302) through the one or more apertures 318, 320, 338 defined by the housing 302. In one example, such an internal electronic component can include one or more sensors that send and receive light or other electromagnetic signals through the one or more apertures 318, 320, 338. In one example, such an internal electronic component can include one or more speakers or speaker modules positioned and oriented to move air through the one or more apertures 318, 320, 338 defined by the housing 302. In at least one example, an aperture defined by the housing 302 that allows access for one or more internal electronic components to interact, communication, or otherwise interface with the external environment can include a port or a port module that is disposed across or occluding the aperture. As described herein, ports and port modules may allow electromagnetic signals, air, pressure waves to pass through the aperture while preventing contaminants such as water and other liquids, dust particles, and other environmental contaminants from passing through the aperture.

Any of the features, components, parts, including the arrangements and configurations thereof shown in FIGS. 1A through 1D can be included, either alone or in any combination, in any of the other examples of devices, features, components, and parts shown in the other figures. Likewise, any of the features, components, parts, including the arrangements and configurations thereof shown in the other figures can be included, either alone or in any combination, in the example of the devices, features, components, and parts shown in FIGS. 1A through 1D.

Figure 2A:
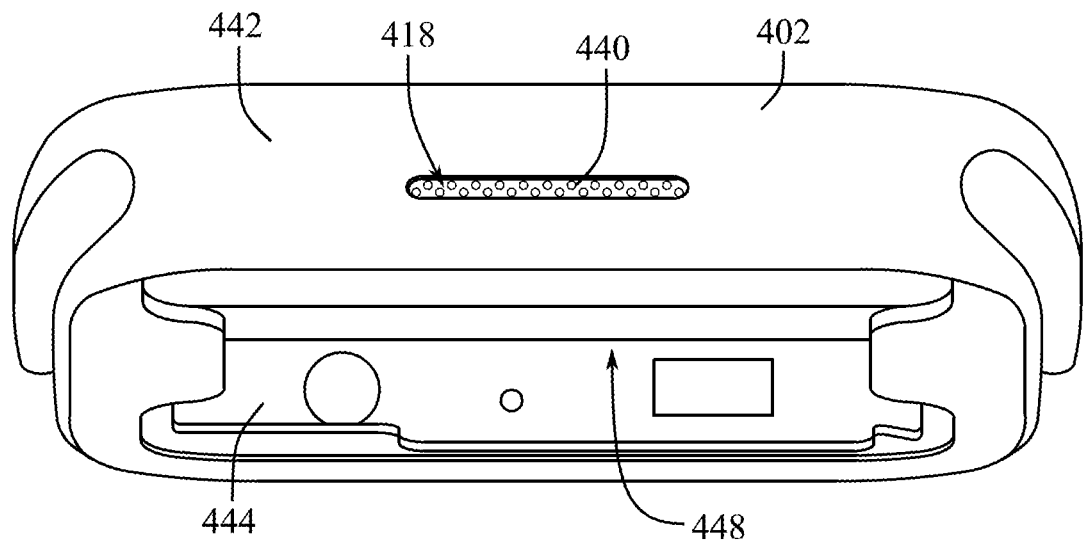
FIG. 2A shows a perspective view of a housing of an electronic device.

FIG. 2A illustrates an example of a housing 402 of an electronic device defining an external surface 442 and an internal surface 444, with the housing defining an aperture 418. The housing 402 can also define an internal volume 448 of an electronic device. In order to prevent dirt, dust, water, or other debris such as salts from the external environment from entering into the internal volume defined by the housing 402, a port or port module 440 can be disposed over or across the aperture 418 as shown. The term "port," as used herein, can include a barrier or material portion that allows air to pass through but prevents or substantially prevents other debris, such as water, dirt, and dust, from passing through to the internal volume of the device. In one example, the port 440 can include multiple components formed, molded, adhered, or otherwise secured together via mechanical securement, to form a single port module that extends across and/or occludes the aperture 418.

Figure 2B:
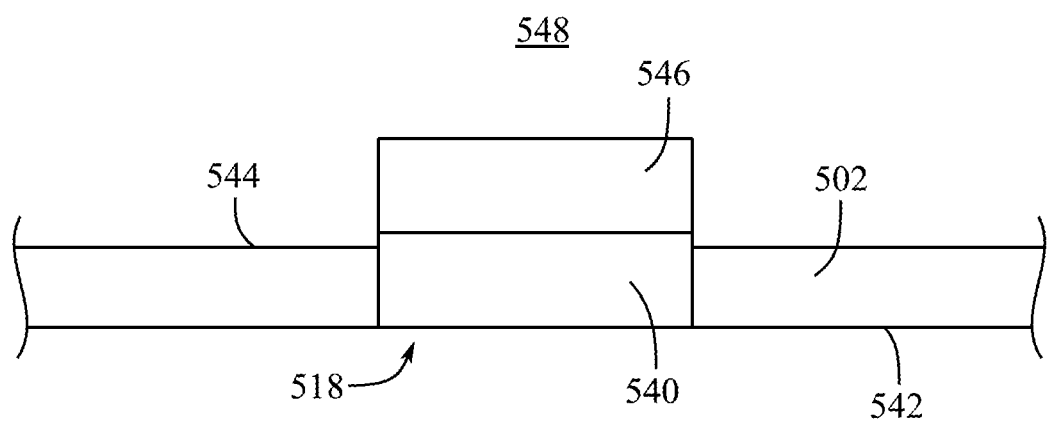
FIG. 2B shows a partial cross-sectional view thereof.

FIG. 2B illustrates a cutout cross-sectional view of a housing 502 similar to the housing 502 shown in FIG. 2A. In the illustrative example, the housing 502 includes an outer surface 542 and an inner surface 544. The housing 402 defines an aperture 518 across which or within which a port 540 is disposed. The housing 502 can define an internal volume 548 of an electronic device. In addition, in at least one example, an electronic component 546 can be positioned within the internal volume 548 and adjacent to the port by 40. And figure to be, the electronic components 546 is positioned directly against the port 540. However, in one or more other examples, the electronic component 546 can be separated by a distance from the port 540 and disposed within the internal volume 548. In at least one example, the electronic component 546 can include a microphone or a speaker.

In at least one example, the electronic component 546 can include a sensor. In one or more other examples, the electronic component 546 can include one or more other components of an electronic device that communicates or otherwise functions as an interface between the internal volume 548 of the electronic device and an external environment through the aperture 518. In at least one example, the port 540 can include two or more components functioning together or formed together to form a single port assembly or port module. As noted above, the port 540 can extend across or within the aperture 518 defined by the housing 502 to prevent or reduce the ingress of particles, liquid, or other undesirable pollutants from entering through the aperture 518 and into the internal volume 548. In one example, such particles, liquids, or other pollutants that may otherwise travel through the aperture 518 can negatively impact the functionality and performance of the electronic component 546, whether the electronic component is a sensor, microphone, speakers, or the like.

In at least one example, the port 540 includes one more membranes extending across the aperture 518 and a support mesh disposed parallel to the membrane and extending across the aperture 518. In some examples, membranes of the port 540 can serve as filters to allow gases and air to pass across the port 540 through the aperture 518 while preventing liquid in particles from passing there through.

Any of the features, components, parts, including the arrangements and configurations thereof shown in FIGS. 2A and 2B can be included, either alone or in any combination, in any of the other examples of devices, features, components, and parts shown in the other figures. Likewise, any of the features, components, parts, including the arrangements and configurations thereof shown in the other figures can be included, either alone or in any combination, in the example of the devices, features, components, and parts shown in FIGS. 2A and 2B.

Figure 3A:
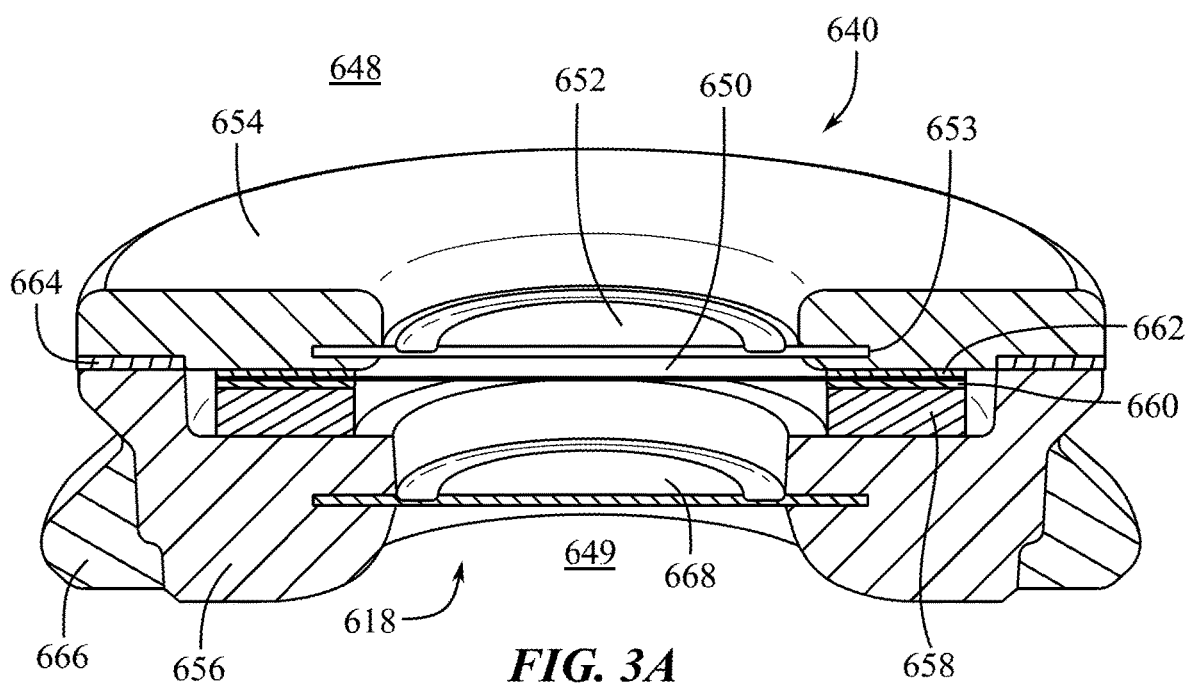
FIG. 3A shows a cross-sectional view of an example of a port of an electronic device.

FIG. 3A shows one example of a port 640 or port assembly including a number of components formed and/or functioning together. As shown in FIG. 3A, the port 640 can include a membrane 650 extending across the aperture 618 and forming a filter or boundary between the internal volume 648 and the external volume 649 of an electronic device. In at least one example, the port 640 can include a support mesh 652 dispose parallel to the membrane 650 and across the aperture 618. In at least one example, the support mesh 652 is separated by a distance from the membrane 650. As shown in the example of FIG. 3A, one or more structural components can be included in the port 640 to secure the membrane 650 and the support mesh 652 in position.

For example, the port 640 can include a cap 654 secured to or supporting the support mesh 652 around a periphery 653 of the support mesh 652. In at least one example, the cap 654 can be structurally stronger and rigid than the support mesh 652. For example, the cap 654 can be made of one or more stronger materials or be formed thicker than the support mesh 652. In at least one example, the cap 654 can be over-molded with the support mesh 652 or at least with a peripheral portion 653 of support mesh such that the cap 654 forms a ring with the support mesh 62 extending across an opening in the cap 654. The opening in the cap 654 can be aligned with the aperture 618.

The Cap 654 can be secured to a snout 656 of the port 640 via an adhesive material or layer 664. In at least one example, adhesives 664 can include a foam adhesive or other compliant material or adhesive that allows for variations in the thickness of the adhesive layers 664 to accommodate manufacturing tolerances and make the assembly of the port 640 easier. The membrane 650 can be secured within the port 640 sandwiched between the snout 656 and the cap 654. One or more other layers or material portions can also be disposed between the snout 656 and the cap 654 to secure the membrane 650 within the port 640 as shown in FIG. 3A. For example, the port 640 can include a foam portion 658 or other elastic material disposed between a surface of the snout 656 and the membrane 650.

The foam portion 658 can remain in compression after assembly of the port 640 such that the foam portion 658 applies a restoring elastic force against the membrane 650 and an opposing surface of the snout 656 as shown. Additionally or alternatively, the port 640 can also include one or more adhesive layers 660, 662 disposed around a periphery of the membrane 650 and securing the membrane 650 to the cap 654 and the foam portion 658. In at least one example, the adhesive layers 660, 662 can include one more adhesive materials or glues including pressure sensitive adhesives and compressible foam materials.

In at least one example, the port 640 can also include the gasket 666 in contact with and at least partially surrounding the snout 656. The gasket 666 can form a seal around the port 640 between the port 640 and a surface of the housing of an electronic device defining the aperture 618. This seal and gasket 666 can prevent gases, liquids, and other particles from entering the internal volume 648 of the electronic device. In this way, gases cross through the aperture 618 only through the membrane 650 and the support mesh 652. In at least one example, the port 640 can also include a cosmetic mesh 668 which is visible from the external environment 649 of the electronic device. The cosmetic mesh 668 is referred to as "cosmetic" herein because it is visible from outside the device. However, in some examples, the cosmetic mesh 668 can be the same or similar to support mesh 652. In some examples, however, the cosmetic mesh 668 can provide primarily a cosmetic and aesthetic function.

As noted above, the support mesh 652 can structurally support the membrane 650 as well as prevent or reduce the chances of the membrane 650 sticking to the support mesh 652. For example, as noted above, some amount of debris or particles from the external environment 649 can pass through the membrane 650 over time. In one example, salt buildup may form between the membrane 650 and the support mesh 652. The support mesh 652, however, can be formed to include features and materials that prevent the debris, such as salt, from binding or sticking the membrane 650 and the support mesh 652 together.

In one example noted above, where a speaker component is disposed adjacent to the port 640 and within the internal volume 648 of an electronic device, the speaker can be positioned and configured to produce pressure waves, air, and vibrations that travel through the aperture 618 from the internal volume 648 to the external environment 649. These pressure waves and air travel through the port 640 and more specifically through the membrane 650 and the support mesh 652 of the port 640. Accordingly, in at least one example, the membrane 650 is acoustically transparent. Also, in at least one example, the support mesh 652 is acoustically transparent such that sounds produced by one more speakers within the internal volume 648 can pass through the port 640. Along these lines, in at least one example, the membrane 650 and/or the support mesh 652 can be air permeable and water impermeable. In this way, the membrane 650 can prevent unwanted particles from entering the internal volume 648 through the aperture 618 while still allowing sound waves, including oscillating pressure waves and vibrations from the speaker to pass through.

In addition, in at least one example, the membrane 650 is formed of a flexible material that deflects and deforms along with pressure waves and vibrations passing there through from the speaker component disposed in the internal volume 648. In this way, in at least one example, the membrane 650 can act as an additional speaker diaphragm. In at least one example, the support mesh 652 can also be flexible. The support mesh 652, for example, can include or be formed of a monofilament string mesh. In one example, to support mesh 652 can be formed of a fabric material such as a woven natural or synthetic fabric. In at least one example, the support mesh 652 is less flexible than the membrane 650. That is, when subjected to the same pressure oscillations or other forces, the membrane 650 tends to deflect more or to a greater degree than the deflection of the support mesh 652.

As noted above, the cosmetic mesh 668 can be the same or similar to the support mesh 652 or in one or more examples the cosmetic mesh 668 can be different then the support mesh 652. For example, the cosmetic mesh 668 can include a rigid plastic or metallic material having one or more pores or perforations formed through a thickness of the cosmetic mesh 668. In one examples, the cosmetic mesh 668 serves primarily an aesthetic purpose as it is visible from the external environment 649.

Figure 3B:
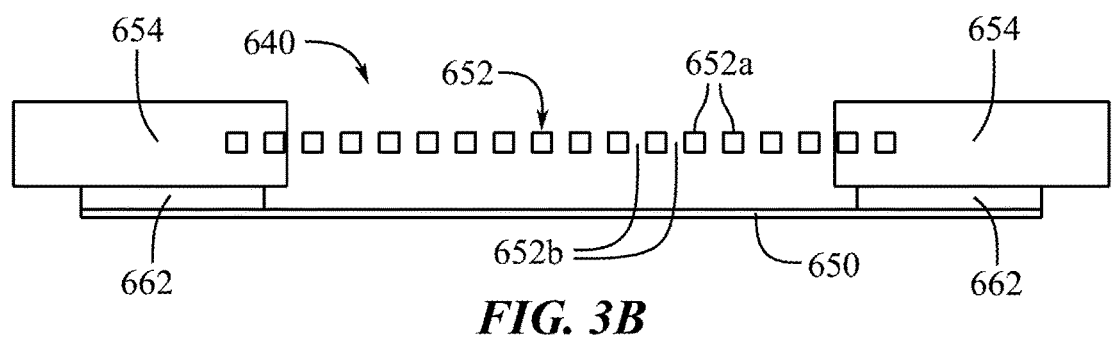
FIG. 3B shows a partial view thereof.
Figure 3C:
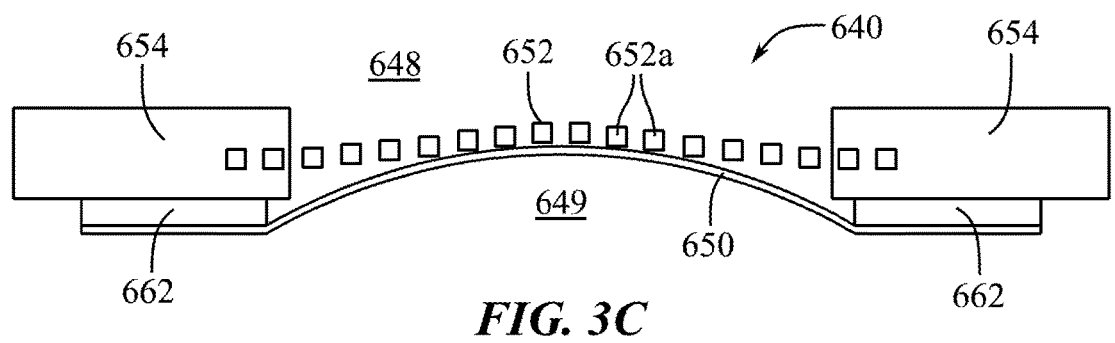
FIG. 3C shows a partial view thereof when exposed to an external pressure.

FIGS. 3B and 3C illustrate partial cross-sectional views of the port 640 including the membrane 650 secured to the cap 654 via adhesive layer 662 with the support mesh 652 secured or over-molded with the cap 654 formed around a periphery thereof. In this view, it is shown that the support mesh 652, which as noted above can be formed of a woven material, can include material portions 652a with spaces 652b separating material portions 652a within the weave pattern. For example, the material portions 652a can represent individual fibers, strings, or other portions of a monofilament string mesh. In another example, the material portions 652a can represent individual fabric threads, strings, and/or fibers. Because the material portions 652a of the support mesh 652 are spaced apart at spaces 652b, the contact area between the membrane 650 and the support mesh 652 is reduced to the cumulative surface area of the material portions 652a only.

As shown in FIG. 3B, the membrane 650 and the support mesh 652 can be disposed generally parallel and spaced apart from one another when neither the membrane 650 nor the support mesh 652 are being acted on by a force to deflect or before man anyway. However, FIG. 3C illustrates a configuration where a force acting on the membrane 650 deflects the membrane 650 upward against the support mesh 652. For example, the electronic device of which the port 640 is a part may be submerged in water such that an external pressure in the external environment 649 is greater than an internal pressure of the device in the internal volume 648. In such a scenario, a pressure forces the membrane 650 to deflect upward as shown. The support mesh 652 disposed adjacent and parallel to the membrane 650 can prevent the membrane 650 from deflecting beyond its capacity to prevent plastic deformation or stretching including tearing, ripping, or other failures that could result from the external pressure acting on the membrane 650.

As shown, the support mesh 652 can structurally strengthen the membrane 650 and prevent damage causing deflections thereof. It is also noted that because of the flexible nature of the support mesh 652, the support mesh 652 can also deflect in response to extra pressure or other forces acting on the port 640. However, because the support mesh 652 is less flexible than the membrane 650, the support mesh 652 will tend to deflect less than the deflection of the membrane 651 when acted upon by the external pressure or other force. In this way, the support mesh 652 structurally supports the membrane 650 when deflected during use as shown in FIG. 3C.

In addition, as noted above, because of the woven fabric the support mesh 652 forms the spaces 652b, contact area between the membrane 650 and the support mesh 652 is limited or reduced to only the surface area of the individual fibers or strands of the support mesh 652 that contact the membrane 650. The reduced contact area between the membrane 650 and the support mesh 652 reduces the chance that particle buildup such as salt buildup between the membrane 650 and the support mesh 652 will cause the membrane 650 and the support mesh 652 to stick together even when not acted on by a pressure or force as explained with reference to FIG. 3C. That is, the binding or sticking effect of any particles such as salt particles and build up existing between the membrane 650 and the support mesh 652 is limited by the contact area between the membrane 650 and the support mesh 652. Because that contact area is reduced based on the woven mesh fibers forming spaces 652b within the support mesh 652, not enough salt or other unwanted particles that would tend to bind the membrane 650 to support mesh 652 can build up between the membrane 650 and the support mesh 652 to cause a permanent binding or sticking.

In at least one example, the flexible elastic nature of the membrane 650 produces a restoring force that urges the membrane 650 away from the support mesh 652 when not acted on by a force as shown in FIG. 3B. Because the contact surface area between the membrane 650 and the support mesh 652 is reduced as described above during a deflection of the membrane 650, not enough salt or other debris can build up to form a binding force that is stronger than the restoring force of the flexible elastic membrane 650. Thus, even if, over time, salt or other debris builds up between the membrane 650 and the support mesh 652, the membrane 650 will remain separated from the support mesh 652 in a resting state such that the membrane 650 can continue to deflect and vibrate in response to passing sound waves and vibrations to maintain a quality of sound produced by a speaker in the internal volume 648 of the electronic device. At the same time, as noted above, the support mesh 652 can provide structural support to preserve the integrity and quality of the membrane 650 when the membrane 650 deflects and deforms to contact the support mesh 652.

In addition, because the support mesh 652 is flexible, the support mesh 652 can also elastically deflect as shown in FIG. 3C when a pressure or force acts on support mesh 652 or the membrane 650. The flexible, elastic nature of the support mesh 652 also produces a restoring force of the support mesh 652 when the support mesh deflects as shown in FIG. 3C. This restoring force of the support mesh 652 acts against the membrane 650 when the membrane 650 contacts the support mesh 652. The restoring force of the elastic flexible support mesh 652 pushes back on the membrane 650 to assist the membrane 650 in restoring to an unbent, un-flexed resting state as shown in FIG. 3B.

In one example noted above, where a speaker component is disposed adjacent to the port 640 and within the internal volume 648 of an electronic device, the speaker can be position and configured to produce pressure waves, air, and vibrations that travel through the aperture 618 from the internal volume 648 to the external environment 649 through the port 640 and more specifically through the membrane 650 and the support mesh 652. Accordingly, in at least one example, the membrane 650 is acoustically transparent. Also, in at least one example, the support mesh 652 is acoustically transparent such that sounds produced by one more speakers within the internal volume 648 can pass through the port 640. Along these lines, in at least one example, the membrane 650 and/or the support mesh 652 can be air permeable and water impermeable. In this way, the membrane 650 can prevent unwanted particles from entering the internal volume 648 through the aperture 618 while still allowing sound waves, including oscillating pressure waves and vibrations from the speaker to pass through.

Additionally or alternatively, in at least one example, the membrane 650 can be porous. In at least one example, the membrane 650 can be non-porous. In at least one example, the membrane 650 can be a barometric membrane.

The example shown in FIGS. 3A-3C includes a single support mesh disposed above or behind the membrane 650. However, this example is not meant as limiting. Rather, in one or more other examples, more than one support mesh 652 can be disposed behind or above the membrane 650, for example, two, three, or more than three support meshes. In such examples, the desired stiffness and compliance of the one or more support meshes 652 can include single layer materials meeting all the material property requirements or each of the one or more support meshes 652 disposed above or behind the membrane 650 can include multiple layers of the same or different materials to meet the requirements. In at least one example, two or more support meshes 652 disposed above or behind the membrane 650 can each comprise a different material. In at least one example, two or more support meshes 652 disposed above or behind the membrane 650 can each comprise the same or similar material.

Any of the features, components, parts, including the arrangements and configurations thereof shown in FIGS. 3A through 3C can be included, either alone or in any combination, in any of the other examples of devices, features, components, and parts shown in the other figures. Likewise, any of the features, components, parts, including the arrangements and configurations thereof shown in the other figures can be included, either alone or in any combination, in the example of the devices, features, components, and parts shown in FIGS. 3A through 3C.

Figure 4A:
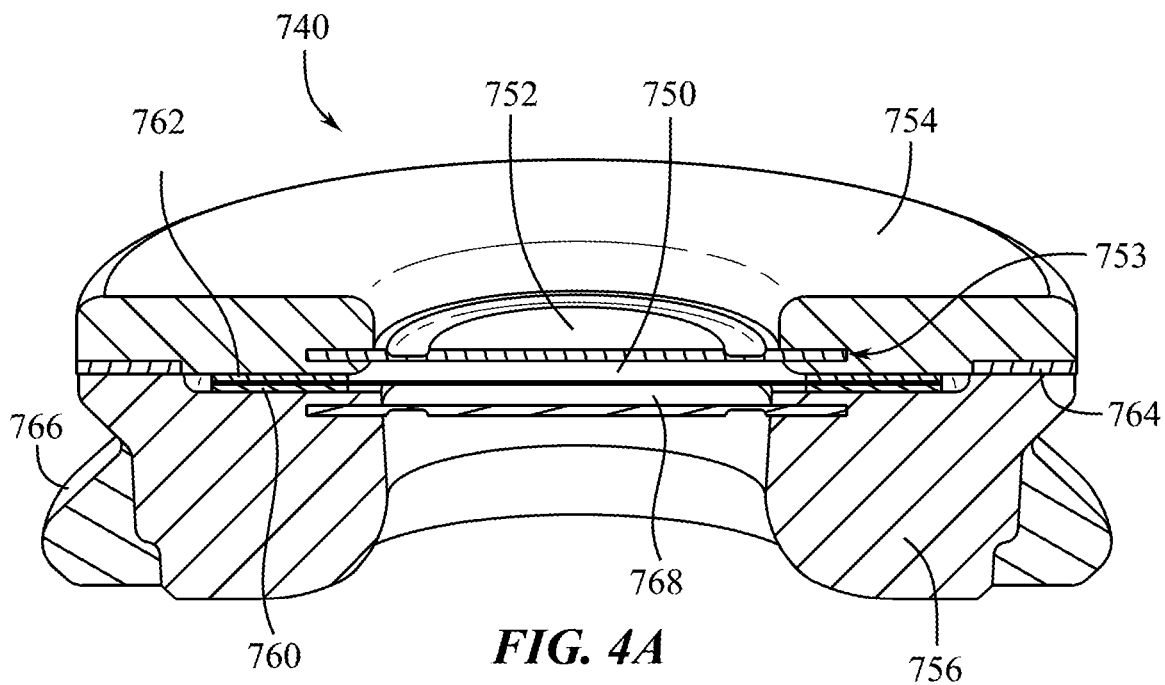
FIG. 4A shows a cross-sectional view of an example of a port of an electronic device.

FIG. 4A illustrates a cross-sectional support another example of a port 740 or port assembly including membrane 750 disposed between a snout 756 and a cap 754. Adhesive layers 760 and 762 secure a periphery of the membrane 750 between the snout 756 and the cap 754. In addition, in at least one example, the port 740 also includes a support mesh 752 with the cap 754 over-molded around a periphery 753 of the support mesh 752. In at least one example, the support mesh 752 and the membrane 750 are disposed generally parallel to one another and spaced apart by a distance. In at least one example, the port 740 also includes a cosmetic mesh 768 secured around periphery thereof by the snout 756. In at least one example, the snout 756 can be over-molded around the periphery of the cosmetic mesh 768. The cosmetic mesh 768 can also be disposed of generally parallel to and spaced apart from the membrane 750. The port 740 can also include a gasket 766 configure to seal the port 740 within an aperture defined by a housing of an electronic device such as those described above with reference to FIGS. 2A and 2B, as well as other figures.

In at least one example, the cosmetic mesh 768 can be a support mesh similar to that of support mesh 752. That is, in at least one example, the cosmetic mesh 768 can include a woven mesh having spaces separating material portions of woven fibers or filaments of the mesh 768 similar to the spaces 652b and material portions 652a of the support mesh 652 shown in FIGS. 3A and 3B. Any of the features and components described with reference to support meshes described herein, including support mesh 652 and support mesh 752, can also apply to cosmetic mesh 768 insofar as the cosmetic mesh 768 can form a support mesh as noted above.

In the example of FIG. 4A, the membrane 750 can be disposed between two opposing support meshes 752, 768. Previous examples and other figures such as FIGS. 3A through 3C show examples where an electronic device is subject to a high external pressure compared to a pressure of an internal volume of a device. However, during use of electronic devices having ports such as those described herein, users can subject the electronic device to environments where the pressures are greater either inside the device or outside the device. In one example, speakers or other components disposed adjacent to the port 740 can send pressure waves and air flow through the port 740 such that the membrane 750 is subject to vibrations and oscillating pressures and forces. During such pressure differences in oscillations, the membrane 750 can deflect in response to internal and external forces.

Figure 4B:
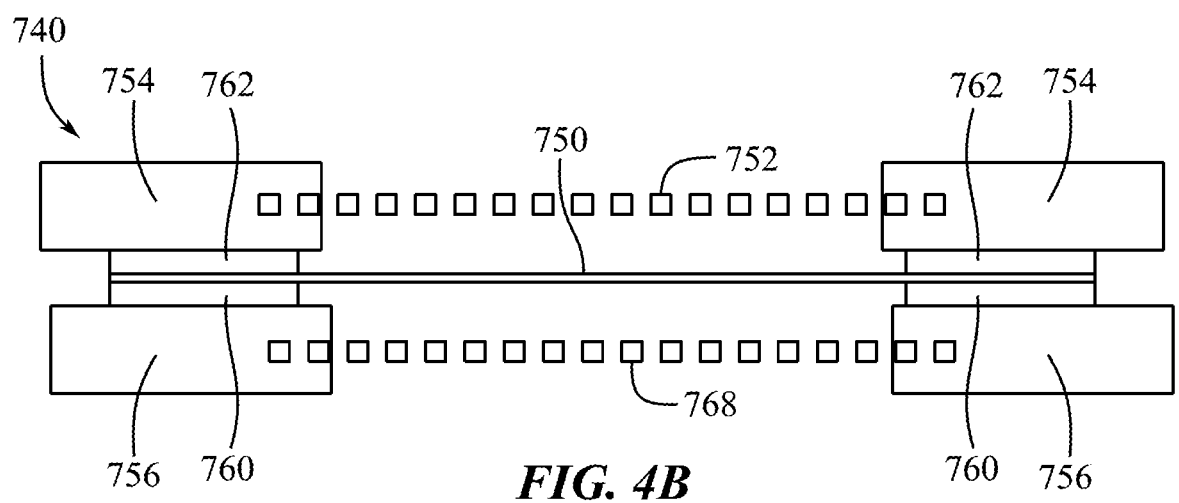
FIG. 4B shows a partial view thereof.

In FIG. 4B, the internal and external pressures of the electronic device in which the port 740 may be disposed are equal. In such conditions, the membrane 750 can be generally flat without any deflection or bending toward either support mesh 752, 768 on either side thereof. In at least one example, the membrane 750 and the support mesh 752, 768 are flexible such that they can deform in response to applied forces and pressures. The term "flexible" as used herein denotes an intentional design feature where the material properties of the component allows the material to bend to such a degree so as to avoid material failure or damage when acted upon by these forces. As used herein, the term flexible denotes an elastic flexibility and material compliance that reacts to, absorbs, and withstands forces and pressures acting on the material without cracking, tearing, ripping, breaking, or otherwise failing during use. The flexibility of these flexible materials of the membrane 750 and support meshes 752, 768 can be inherent in the materials used to form the membrane 750 and support meshes 752, 768 or arise from the construction and configuration and methods used to form the membrane 750 and the support meshes 752, 768. In one example, the support meshes 752, 768 include single strand woven fibers including wire meshes, fabric meshes, and other fibers meshes. The membrane 750 can likewise include flexible materials such as meshes, rubbers, porous materials such as foams, and the like.

In contrast, the term "rigid," as used herein, denotes material properties that do not lend to the elastic flexing or bending of parts. For example, the cap 754 and the snout 756 can be rigid or include rigid materials that are not designed or meant to flex, bend, or otherwise deform noticeably or to any extent that would hinder the function of the part under normal use. For example, the external pressures exerted on the port 740 during submersion in water are generally not great enough to cause the rigid components of the port 740, including the cap 754 and snout 756, to deform to such a degree that the gasket 766 does not form a tight seal or so that the cap 754 or snout 756 do not properly secure the support meshes 752, 768, respectively. Thus, the flexible components of the port 740, including the support meshes 752, 768 and the membrane 750 are designed to elastically deflect during use and the rigid components, including the cap 754 and the snout 756 are designed not to flex or deform when subject to the same forces and pressures.

Figure 4C:
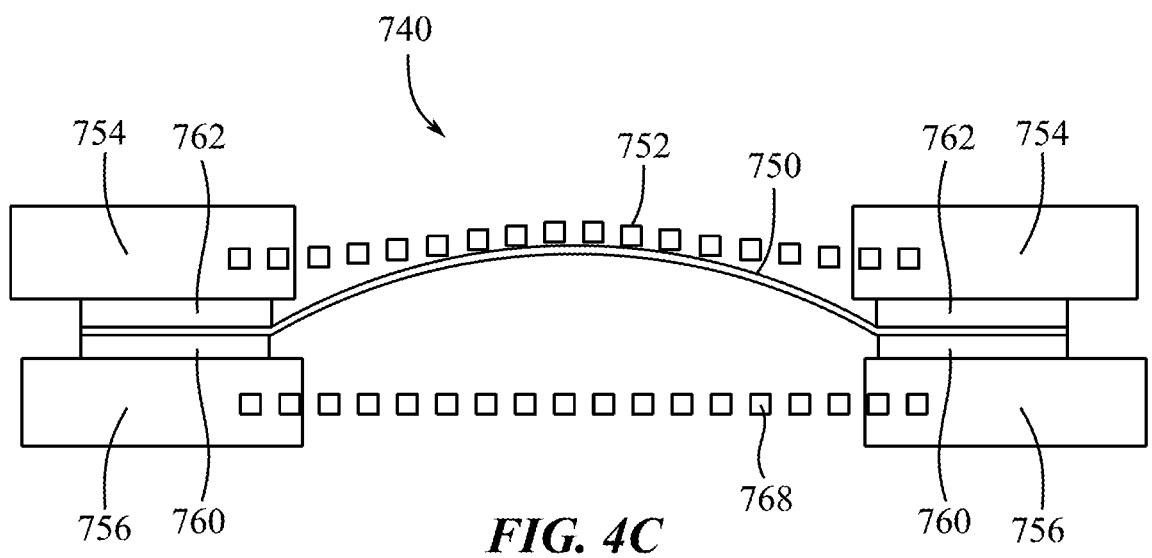
FIG. 4C shows a partial view thereof when exposed to an external pressure.

In at least one example, the membrane 750 is more flexible than what the support meshes 742, 768 disposed on either side thereof. In this way, as shown in FIG. 4C, when an external pressure horses remembering 715 to deflect upward against the support mesh 752, the support mesh 752 also flexes or deflects to a degree but maintains a maximum deflection against the membrane 750 that supports the membrane 750 structurally. Also, as noted above with reference to other examples, the support mesh 752 can provide a restoring force once the external force is gone such that the support mesh 752 pushes downward on the membrane 750 to return the membrane 750 to a resting state position as shown in FIG. 4B.

Figure 4D:
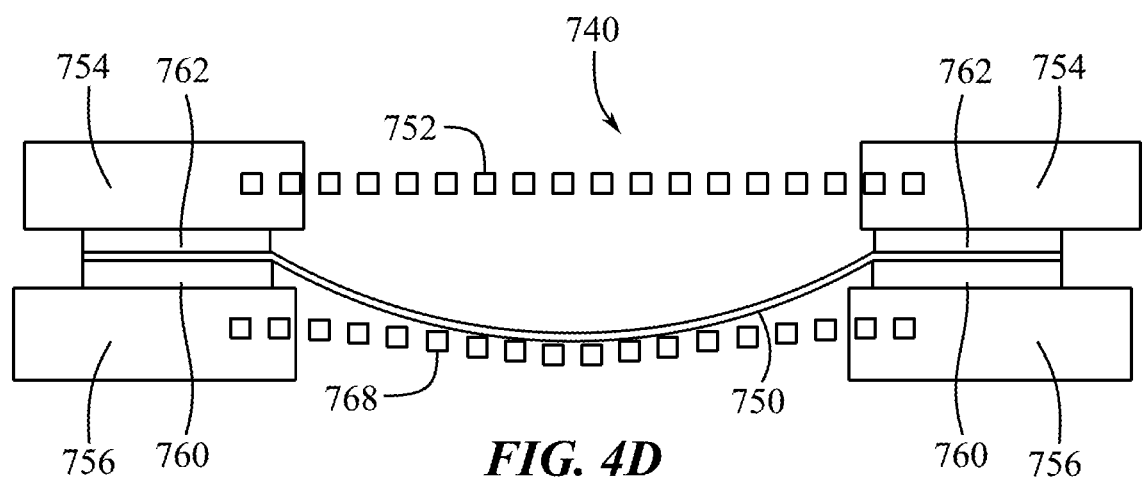
FIG. 4D shows a partial view thereof when exposed to an internal pressure.

Likewise, as shown in FIG. 4D, when an internal pressure of the device of which the port 740 maybe a part causes the membrane 750 to deflect downward, the membrane 750 presses against the cosmetic/support mesh 768 and the support mesh 768 structurally supports the membrane 750, preventing the membrane 750 from deflecting to the point of failure. The support mesh 768 can also deflect to a lesser degree than the deflection of the membrane 750 and the support mesh 768 can provide a restoring force upward on the membrane 750 to return the membrane 750 to a resting state position as shown in FIG. 4B when the internal and external pressures are equalized.

As noted above with reference to other examples, because of the spaces between woven material fibers or material portions of the support meshes 752, 768, a contact area between the deflected membrane 750 and the opposing support meshes 752, 768, as shown in FIGS. 4C and 4D, is reduced such that sticking between the membrane and support meshes 72, 768 is reduced or eliminated. In this way, even as unwanted particles and other pollutants such as salts migrate through membrane 750, the build up at the contact area between the membrane 750 and the support meshes 52, 68 are minimal enough that the restoring force of the elasticity of membrane 750 and the restoring forces of the support meshes 752, 768 pushing back on or opposing the contacting membrane 750 can overcome any sticking forces or adhesion forces from the salt or other polluting particles.

In one example noted above, where a speaker component is disposed adjacent to the port 740 and within the internal volume 748 of an electronic device, the speaker can be position and configured to produce pressure waves, air, and vibrations that travel through the aperture 718 from the internal volume 748 to the external environment 749 through the port 740 and more specifically through the membrane 750 and the support mesh 752. Accordingly, in at least one example, the membrane 750 is acoustically transparent. Also, in at least one example, the support mesh 752 is acoustically transparent such that sounds produced by one or more speakers within the internal volume 748 can pass through the port 740. Along these lines, in at least one example, the membrane 750 and/or the support mesh 752 can be air permeable and water impermeable. In this way, the membrane 750 can prevent unwanted particles from entering the internal volume 748 through the aperture 718 while still allowing sound waves, including oscillating pressure waves and vibrations from the speaker to pass through.

Additionally or alternatively, in at least one example, the membrane 750 can be porous. In at least one example, the membrane 750 can be non-porous. In at least one example, the membrane 750 can be a barometric membrane.

Any of the features, components, parts, including the arrangements and configurations thereof shown in FIGS. 4A through 4D can be included, either alone or in any combination, in any of the other examples of devices, features, components, and parts shown in the other figures. Likewise, any of the features, components, parts, including the arrangements and configurations thereof shown in the other figures can be included, either alone or in any combination, in the example of the devices, features, components, and parts shown in FIGS. 4A through 4D.

Figure 5A:
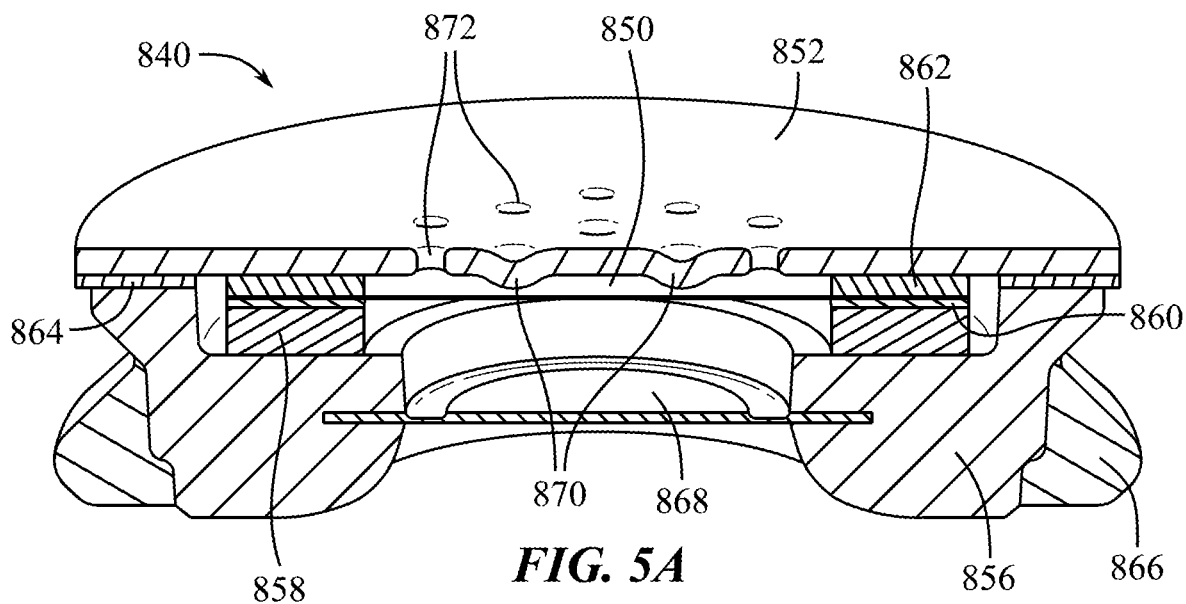
FIG. 5A shows a cross-sectional view of an example of a port of an electronic device.

FIG. 5A illustrates another example of a port 840 that includes a membrane 850 disposed across an aperture and sandwiched between a support mesh 852 and a cosmetic mesh 868. In the Illustrated example, the membrane 850 is adhered on each side around the periphery of membrane 850 with adhesive layers 862 and 860. A foam portion 858 is also disposed between the adhesive layer 860 and the upper surface of snout 856. In at least one example, when assembled together, the foam portion 858 can be compressed between the snout 856 and the support mesh 852 in order to accommodate manufacturing and assembly tolerances. In at least one example, an additional adhesive layer 864 can adhere the snout 856 directly to the support mesh 852 around the peripheral edge or portion of the support mesh 852. The port 840 can also include a gasket 866 to seal the port 840 within and across an aperture of an electronic device.

In the illustrated example of FIG. 5A, the support mesh 852 is not integrated or over-molded with a rigid cap as shown and other figures and describe with reference other examples herein. Rather, in at least one example, the support mesh 852 can form a rigid cap over an end of the port 840. In at least one example, the support mesh 852 can be formed with a more rigid material such as a plastic or metal that does not appreciably deform in response to pressure differences and forces, which may act on the port 840 during normal use of the device, to a degree that negatively affects the structural support functionality of the support mesh 852. In addition, in at least one example, the support mesh 852 of the port 840 can include perforations 872. The perforations 872 can include one more apertures or through-holes defined by the support mesh 852 forming passageways through a thickness of the support mesh 852. In this way, air can flow through the support mesh 852. In at least one example, the perforations 872 can be sized such that they block larger particles and other unwanted pollutants from entering the device through the port 840.

The Port 840 shown in FIG. 5A can also include a cosmetic mesh 868. As noted above, cosmetic mesh 868 is referred to as such because it can be seen from an exterior environment. The cosmetic mesh 868 can be outward facing to form a portion of an outside surface of the device of which the port 840 is a part. The cosmetic mesh 868 can be a support mesh as described in other examples herein or be formed to have the same or similar features and construction as that of the support mesh 852.

Figure 5B:
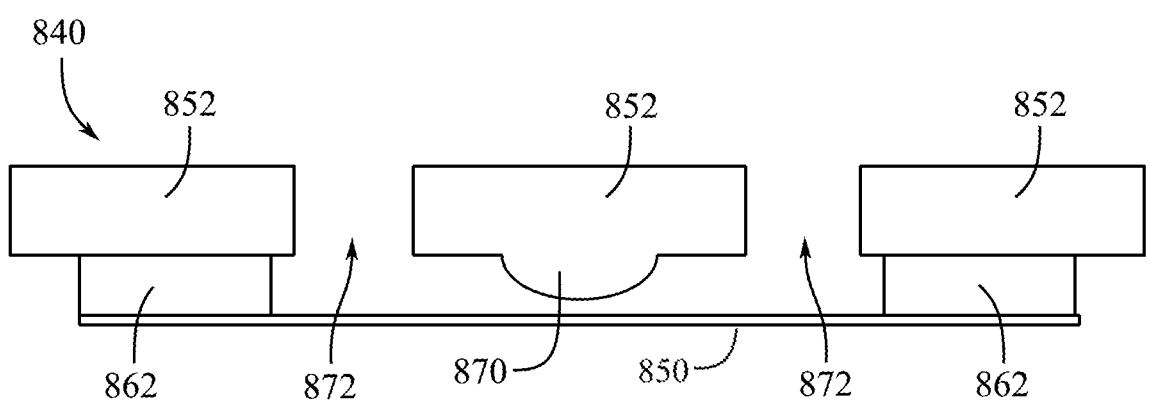
FIG. 5B shows a partial view thereof.

In at least one example, the support mesh 852 can include one or more contact area reduction features including surface features such as one or more protruding dimples 870 extending downward toward the membrane 850. FIG. 5B shows a cross-sectional view of a portion of the port 840 including the membrane 850 secured to support mesh 852 via the adhesive layer of 862 with the support mesh 852 having perforations 872. The dimple 870 extends downward toward the membrane 850. In the illustrated example, the dimple 870 is a rounded feature with a curved surface. However, it will be appreciated that one or more other examples of surface features of the support mesh 852 can include protrusions and dimples of other shapes, sizes, and numbers.

Figure 5C:
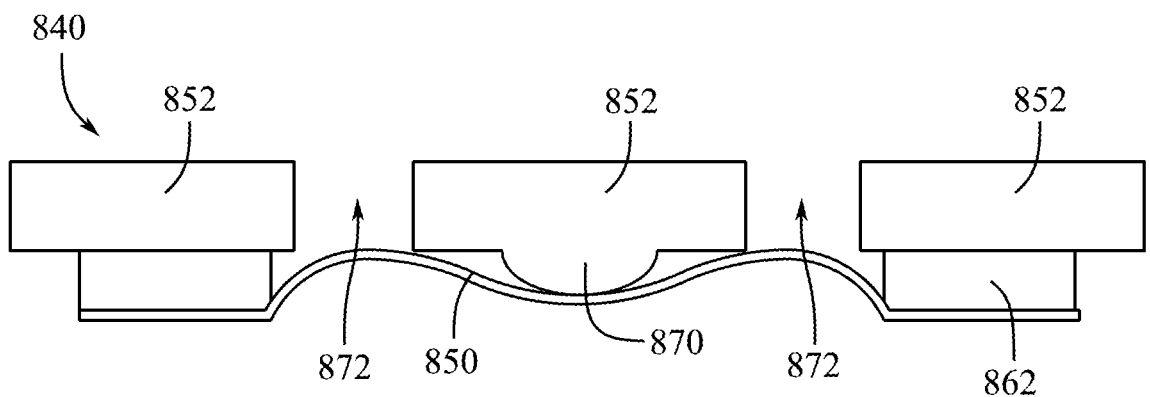
FIG. 5C shows a partial view thereof when exposed to an external pressure.

As shown in the cross-sectional view of FIG. 5C, when an external pressure acts upward on the membrane 850, the membrane 850 can be flexible such that it deflects upward against the support mesh 852. In the illustrated example, because the dimple 870 extends downward, the membrane 850 contacts the dimple 870 such that the surface area contact between the membrane 850 and the support mesh 852 is reduced to the area or a portion of the dimple 870, for example the lowermost portion or point of the dimple 870. FIG. 5C also shows that one or more other points or portions of support mesh 852 can also be contacted by the deflected membrane 850. For example, the membrane 850 may also contact what are more points at the edges of perforations 872.

The dimple 870 and the perforations 872 reduce the surface area contact between the deflected membrane 850 and the support mesh 852. The support mesh 852, as noted above, is rigid or at least more rigid than membrane 850 such that the support mesh 852 structurally supports the membrane 850 and prevents the membrane 850 from deflecting too far and experiencing strains that result in material failure or damage to the membrane 850. As noted above with reference to other examples, the reduced contact surface area between the membrane 850 and the support mesh 852 correspondingly reduces sticking between the membrane 850 and the support mesh 852.

Any of the features, components, parts, including the arrangements and configurations thereof shown in FIGS. 5A through 5C can be included, either alone or in any combination, in any of the other examples of devices, features, components, and parts shown in the other figures. Likewise, any of the features, components, parts, including the arrangements and configurations thereof shown in the other figures can be included, either alone or in any combination, in the example of the devices, features, components, and parts shown in FIGS. 5A through 5C.

Figure 6A:
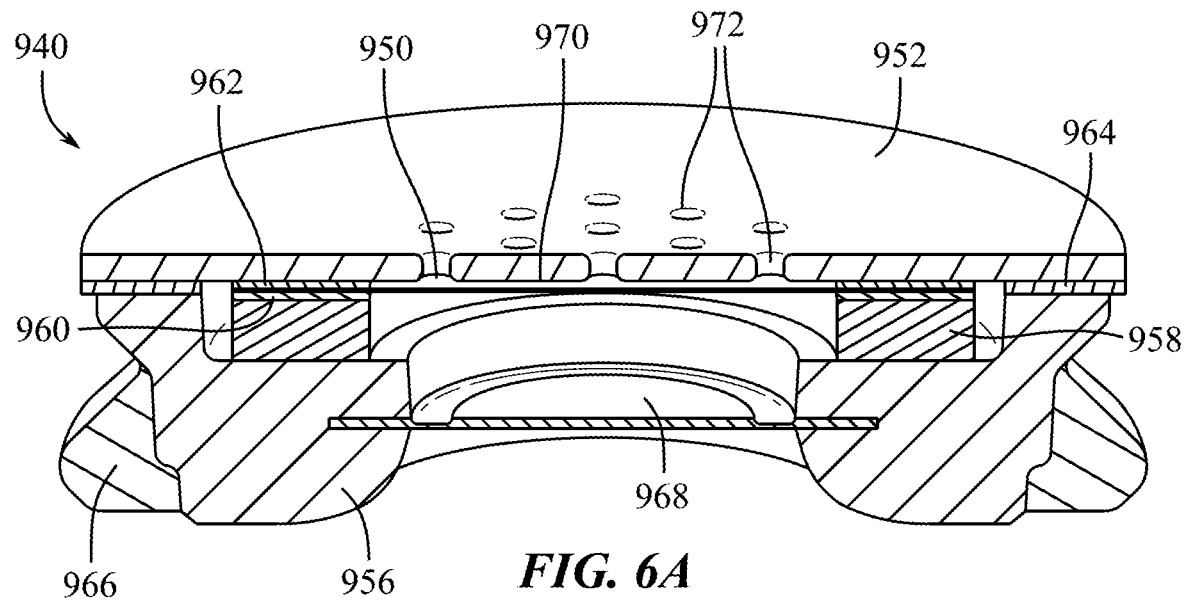
FIG. 6A shows a cross-sectional view of an example of a port of an electronic device.

FIG. 6A illustrates another example of a port 940 that includes a membrane 950 disposed across an aperture and between a support mesh 952 and a cosmetic mesh 968. In The illustrated example, the membrane 950 is adhered on each side around the periphery of the membrane 950 with adhesive layers 962 and 960. A foam portion 958 can also be disposed between the adhesive layer 960 and the upper surface of a snout 956. In at least one example, the foam portion 958 can be compressed between the snout 956 and the support mesh 952 when the port 940 is assembled together in order to accommodate manufacturing and assembly tolerances. In at least one example, an additional adhesive layer 964 can adhere the snout 956 directly to the support mesh 952 around the peripheral edge or portion of the support mesh 952. The port 940 can also include a gasket 966 to seal the port 940 within an aperture of an electronic device, similar to gaskets discussed with reference to other examples in other figures.

In the illustrated example of FIG. 6A, the support mesh 952 is not integrated or over-molded with a rigid cap as shown and other figures and describe with reference to other examples herein. Rather, in at least one example, the support mesh 952 can form a rigid cap over an end of the port 940. In at least one example, the support mesh 952 can be formed with a more rigid material such as a plastic or metal that does not appreciably deform in response to pressure differences and forces, which may act on the port 940 during normal use of the device, to a degree that negatively affects the structural support functionality of the support mesh 952. The perforations 972 can be one more apertures defined by the support mesh 952 forming passageways through a thickness of the support mesh 952. In this way, air can flow through the support mesh 952. In at least one example, the perforations 972 can be sized such that they block larger particles and other unwanted pollutants like salts and dust from entering the device through the port 940.

The port 940 shown in FIG. 6A can also include a cosmetic mesh 968. As noted above, the cosmetic mesh 968 is referred to as such because it can be seen from an exterior environment. The cosmetic mesh 968 can be outward facing to form a portion of an outside surface of the device of which the port 940 is a part. The cosmetic mesh 968 can be a support mesh as described in other examples herein or be formed to have the same or similar features and construction as that of the support mesh 952.

Figure 6B:
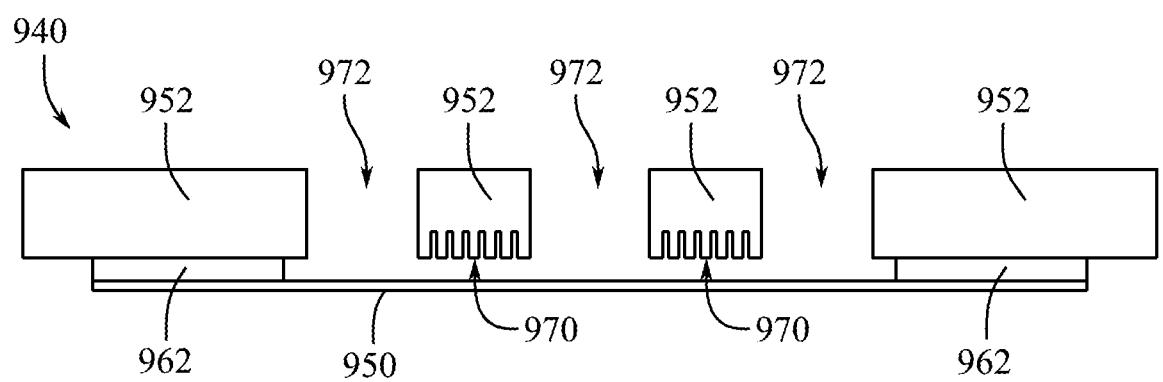
FIG. 6B shows a partial view thereof.

In at least one example, the support mesh 952 can include one or more contact area reduction features including surface features such as micro-texture features 970 formed on a side of the support mesh 952 facing the membrane 950. FIG. 6B shows a cross-sectional view of a portion of the port 940 including the membrane 950 secured to support mesh 952 having perforations 972 via the adhesive layer 962. The micro-texture features 970 can be formed on a surface of the support mesh 952 facing the membrane 950. In at least one example, as illustrated in FIG. 6A, the micro-texture features 970 include portions of material removed from the support mesh 952 forming grooves, notches, or valleys extending into a thickness of the support mesh 952. While the illustrated example shows micro-texture features 970 including repeating notches or grooves, other examples can include micro-texture features 970 that include other shapes, sizes, numbers, and arrangements of micro-textures features. In at least one example, any of the micro-features described herein can be formed using a laser cutting method, chemical etching method, micro-machining method, or any other method that forms micro-features in the surface of the support mesh 952 as shown.

In at least one example, the micro-texture features 970 subtract from the surface area of the support mesh 952 facing the membrane 950 such that a total contact area available to make contact with the membrane 950 during use is reduced. As shown in the cross-sectional view of FIG. 6C, when an external pressure acts upward on the membrane 950, the membrane 950 can be flexible such that it deflects upward against the support mesh 952. In The Illustrated example, because the micro-texture features 970 face downward, the membrane 950 contacts the micro-texture features 970 such that the surface area contact between the membrane 950 and the support mesh 952 is reduced to the remaining surface area of the support mesh 952 not removed by the micro-texture features 970.

The support mesh 952, as noted above, can be rigid or at least more rigid than the membrane 950 such that the support mesh 952 structurally supports the membrane 950 and prevents the membrane 950 from deflecting too far and experiencing strains that result in material failure or damage to the membrane 950. As noted above with reference to other examples, the reduced contact surface area between the membrane 950 and the support mesh 952 correspondingly reduces sticking between the membrane 950 and the support mesh 952.

Figure 6C:
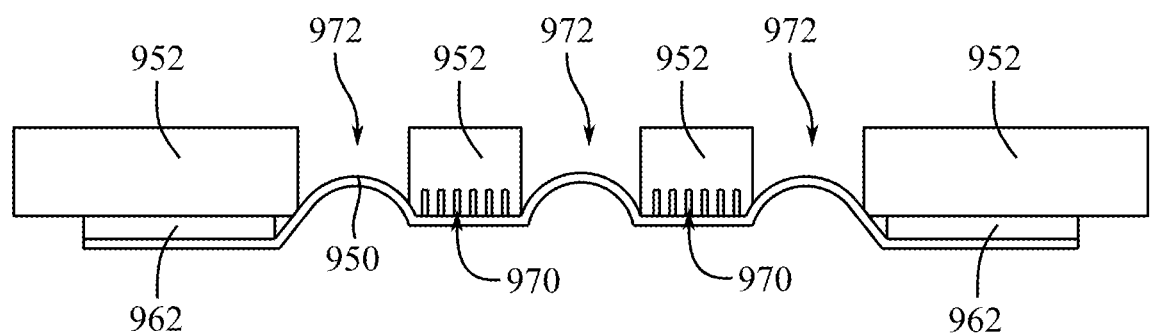
FIG. 6C shows a partial view thereof when exposed to an external pressure.
Figure 6D:
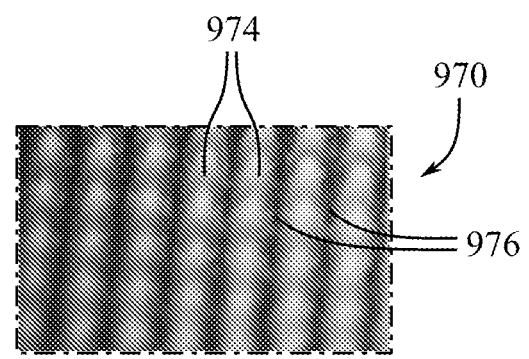
FIG. 6D shows an example of a micro-texture surface feature.

FIG. 6D illustrates a topographical view of an example of micro-texture features 970 including laser cut peaks 974 and valleys 976 that reduces the contact area between the micro-textured surface of the support mesh 952 and the membrane 950 (as shown in FIG. 6C). The micro-texture features 970 shown in FIG. 6D include generally equally spaced apart, pyramid shaped features forming the peaks 974 with the valleys 976 including spaces between the pyramids. The illustrated example of FIG. 6D is one configuration of micro-textured feature 970 but other examples, as noted above, can include any number of shapes, arrangements, patterns, sizes, and numbers of features that reduce the contact area of the lower surface of the support mesh 952.

Any of the features, components, parts, including the arrangements and configurations thereof shown in FIGS. 6A through 6D can be included, either alone or in any combination, in any of the other examples of devices, features, components, and parts shown in the other figures. Likewise, any of the features, components, parts, including the arrangements and configurations thereof shown in the other figures can be included, either alone or in any combination, in the example of the devices, features, components, and parts shown in FIGS. 6A through 6D.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. An electronic device comprising:
   a housing defining an aperture;
   a membrane extending across the aperture; and
   a non-metallic woven support mesh disposed parallel to the membrane and extending across the aperture;
   wherein:
   the support mesh defines a plurality of perforations; and
   a micro-texture feature disposed on a surface of the support mesh facing the membrane, the micro-texture feature disposed between adjacent perforations of the plurality of perforations and within the aperture.

2. The electronic device of claim 1, wherein the membrane is acoustically transparent.

3. The electronic device of claim 1, wherein the membrane is air permeable and water impermeable.

4. The electronic device of claim 1, wherein the support mesh comprises a monofilament string mesh.

5. The electronic device of claim 4, wherein the support mesh comprises a fabric.

6. The electronic device of claim 1, wherein the support mesh is less flexible than the membrane.

7. The electronic device of claim 1, wherein:
   the support mesh is a first support mesh;
   the electronic device further comprises a second support mesh extending across the aperture parallel to the membrane; and
   the membrane is disposed between the first support mesh and the second support mesh.

8. The electronic device of claim 7, wherein the second support mesh comprises a cosmetic mesh.

9. The electronic device of claim 8, wherein the second support mesh comprises a non-metallic woven material.

10. The electronic device of claim 8, wherein the cosmetic mesh comprises a metal or a plastic.

11. An electronic device port, comprising:
    an aperture defined by a housing;
    a support mesh;
    a cosmetic mesh spaced apart from the support mesh; and
    a water impermeable membrane occluding the aperture and disposed between the support mesh and the cosmetic mesh;
    wherein a surface of the support mesh facing the water impermeable membrane comprises a dimple protruding toward the water impermeable membrane and aligned with the aperture.

12. The electronic device port of claim 11, wherein the support mesh comprises a flexible woven mesh.

13. The electronic device port of claim 11, wherein the support mesh includes a rigid perforated mesh comprising metal or plastic.

14. The electronic device port of claim 11, wherein the contact area reduction feature comprises a dimple.

15. The electronic device port of claim 11, wherein the contact area reduction feature comprises a micro-texture surface feature.

16. An electronic port assembly defining a port, the assembly comprising:
    a first woven support mesh extending across the port;
    a second woven support mesh extending across the port and spaced apart from the support mesh; and
    a water impermeable membrane extending between the first woven support mesh and the second woven support mesh;
    wherein a surface of the first woven support mesh facing the water impermeable membrane comprises a plurality of perforations and at least one of a micro-groove, a micro-notch, or a micro-valley disposed between adjacent perforations of the plurality of perforations and extending into a thickness of the first woven support mesh and aligned with the port and configured to reduce a contact area between the first woven support mesh and the water impermeable membrane.

17. The electronic port assembly of claim 16, wherein the water impermeable membrane is more flexible than the first woven support mesh and the second woven support mesh.

18. The electronic port assembly of claim 16, wherein the second woven support mesh is a cosmetic mesh.

19. The electronic port assembly of claim 16, further comprising a mesh cap over-molded around a periphery of the first woven support mesh.

* * * * *